(12) United States Patent
Persoone et al.

(10) Patent No.: US 7,709,095 B2
(45) Date of Patent: May 4, 2010

(54) INFRA-RED REFLECTING LAYERED STRUCTURE

(75) Inventors: Peter Persoone, Deinze (BE); Koen Vlaeminck, Wetteren (BE); Hugo Lievens, Ghent (BE)

(73) Assignee: NV Bekaert SA, Zwevegem (BE)

( * ) Notice: Subject to any disclaimer, the term of this patent is extended or adjusted under 35 U.S.C. 154(b) by 533 days.

(21) Appl. No.: 10/533,890

(22) PCT Filed: Oct. 23, 2003

(86) PCT No.: PCT/EP03/50747

§ 371 (c)(1),
(2), (4) Date: Jul. 1, 2005

(87) PCT Pub. No.: WO2004/042435

PCT Pub. Date: May 21, 2004

(65) Prior Publication Data

US 2006/0057399 A1 Mar. 16, 2006

(30) Foreign Application Priority Data

Nov. 5, 2002 (EP) ................................. 02079711

(51) Int. Cl.
*B32B 17/06* (2006.01)
(52) U.S. Cl. .................. 428/432; 428/433; 428/434; 428/698; 428/699; 428/701; 428/702
(58) Field of Classification Search ................ 428/433, 428/434, 698, 699, 701, 702, 432
See application file for complete search history.

(56) References Cited

U.S. PATENT DOCUMENTS

| 2,456,241 | A | 12/1948 | Axler et al. |
| 3,649,359 | A | 3/1972 | Apfel et al. |
| 4,240,696 | A | 12/1980 | Tracy et al. |
| 4,716,086 | A | 12/1987 | Gillery et al. |
| 4,799,745 | A | 1/1989 | Meyer et al. |

(Continued)

FOREIGN PATENT DOCUMENTS

EP 0 336 257 B1 12/1993

(Continued)

OTHER PUBLICATIONS

K. Okimura "Low temperature growth of rutile $TiO_2$ films in modified rf magnetron sputtering", Surface and Coatings Technology, vol. 135, Issues 2-3, Jan. 15, 2001, pp. 286-290.*

(Continued)

*Primary Examiner*—Ling Xu
(74) *Attorney, Agent, or Firm*—Foley & Lardner LLP

(57) ABSTRACT

The invention relates to an infra-red reflecting layered structure comprising a transparent substrate layer; a first metal oxide layer; a first silver containing layer, a second metal oxide layer; a second silver containing layer and a third metal oxide layer. The first, second and third metal oxide layer have a refractive index of at least 2.40 at a wavelength of 500 nm. The layered structure according to the present invention laminated on glass has a visual light transmittance (VLT) higher than 70% and a solar heat gain coefficient (SHGC) lower than 0.44. The invention further relates to the use of a layered structure as a transparent heat-mirror.

8 Claims, 7 Drawing Sheets

U.S. PATENT DOCUMENTS

| | | | |
|---|---|---|---|
| 4,996,105 A * | 2/1991 | Oyama et al. | 428/336 |
| 5,071,206 A | 12/1991 | Hood et al. | |
| 5,296,302 A | 3/1994 | O'Shaughnessy et al. | |
| 5,419,969 A * | 5/1995 | Miyazaki et al. | 428/426 |
| 5,591,529 A | 1/1997 | Braatz et al. | |
| 5,593,786 A * | 1/1997 | Parker et al. | 428/426 |
| 5,595,825 A | 1/1997 | Guiselin | |
| 5,948,538 A | 9/1999 | Brochot et al. | |
| 6,262,830 B1 | 7/2001 | Scalora | |
| 2002/0136905 A1 | 9/2002 | Medwick et al. | |

FOREIGN PATENT DOCUMENTS

| | | |
|---|---|---|
| EP | 1 010 677 A1 | 6/2000 |
| WO | WO-99/36809 A1 | 7/1999 |

OTHER PUBLICATIONS

A.A. Maradudin et al., "Photonic band structure of a truncated, two-dimensional, periodic dielectric medium," Journal of Optical Society of America B, vol. 10, No. 2, Feb. 1993, pp. 307-313.

B.E. A. Saleh et al., "Fundamentals of Photonics," Second Edition, pp. 58-66, 243-279, (2007).

C. Woodward et al., "Polymeric 1-D Photonic Crystals," printed from Internet 2007.

C.M. Bowden et al., "Development and Applications of Materials Exhibiting Photonic Band Gaps," Introduction, Journal of Optical Society of America B, vol. 10, No. 2, Feb. 1993.

D.L. Bullock et al., "Photonic band structure investigation of two-dimensional Bragg reflector mirrors for semiconductor laser mode control," Journal of Optical Society of America B, vol. 10, No. 2, Feb. 1993, pp. 399-403.

D.R. Smith et al., "Photonic band structure and defects in one and two dimensions," Journal of Optical Society of America B, vol. 10, No. 2, Feb. 1993, pp. 314-321.

E. Yablonovitch, "Engineered omnidirection external-reflectivity spectra from one-dimensional layered interference filters," Optics Letters, vol. 23, No. 21, Nov. 1, 1998, pp. 1648-1649.

E. Yablonovitch, "Photonic band-gap structures," Journal of the Optical Society of America B, vol. 10, No. 2, Feb. 1993, pp. 283-295.

E. Yablonovitch, "Photonic Crystals: Semiconductors of Light," Scientific American, Dec. 2001, pp. 47-55.

E.E. Barr, "Visible and Ultraviolet Bandpass Filters," Optical Coatings-Applications and Utilization, Proceedings of the Society of Photo-Optical Instrumentation Engineers, vol. 50, 1974, pp. 87-118.

H.A. Macleod, "A new approach to the design of metal-dielectric thin-film optical coatings," Optica Acta, vol. 25, No. 2, 1978, pp. 93-106, (May 23, 1977).

H.A. Macleod, "Multiple Cavity Metal-Dielectric Filters," Thin-film Optical Filters, Second Edition, 1986, Bristol:Adam Hiliger, pp. 292-308.

H.S. Sözüer et al., "Photonic bands: Convergence problems with the plane-wave method," Physical Review B, vol. 45, No. 24, Jun. 15, 1992-II, pp. 13 962-13 972.

J. Kouba et al., "Conference 6182: Photonic Crystal Materials and Devices: Metallic photonic crystal for THz radiation," 6182-34, Session 6, An SPIE Europe Event, p. 18, (Apr. 6, 2006).

J.H. Apfel, "Graphics in Optical Design," Applied Optics, vol. 11, No. 6, Jun. 1972, pp. 1303-1312.

Juh-Tzeng Lue et al., "Optical filters constructed from multilayers of dielectric and thin metallic films operating in the anomalous skin effect region," Journal of the Optical Society of America B, vol. 6, No. 6, Jun. 1989, pp. 1103-1105.

K.M. Ho et al., "Existence of a Photonic Gap in Periodic Dielectric Structures," Physical Review Letters, vol. 65, No. 25, Dec. 17, 1990, pp. 3152-3155.

M. Scalora et al., "Metals under a new light," Optics and Photonics News, Sep. 1999, 10(9), pp. 24-27.

M. Scalora, "Photonic Band Gap Metal Films for Light Filtering Applications," pp. 1-6.

Macleod Medium, vol. 7, No. 1, Mar. 1999, pp. 1-8.

Macleod Medium, vol. 7, No. 3, Oct. 1999, pp. 1-8.

P. Persoone et al., "Spectrally selective optical filter for many applications," AIMCAL 2003 Fall Technical Conference and 17th International Vacuum Web Coating Conference, Oct. 26-29, 2003, pp. 1-8.

P. Persoone et al., "Spectrally selective optical filter for many applications," Powerpoint Presentation, AIMCAL 2003 Fall Technical Conference and 17th International Vacuum Web Coating Conference, Oct. 26-29, 2003, pp. 1-17.

P.H. Berning et al., "Induced Transmission in Absorbing Films Applied to Band Pass Filter Design," Journal of the Optical Society of America B, vol. 47, No. 3, Mar. 1957, pgs. 230-239.

R. Guether, "The Berlin scientist and educator Wilhelm Zenker (1829-1899) and the principle of color selection," Proceedings of the Society of Photo-Optical Instrumentation Engineers, 1999, 3738:pp. 20-29.

R.D. Meade et al., "Accurate theoretical analysis of photonic bandgap materials," Brief Reports, Physical Review B, vol. 48, No. 11, Sep. 15, 1993-I, pp. 8434-8437.

R.D. Meade et al., "Nature of the photonic band gap: some insights from a field analysis," Journal of Optical Society of America B, vol. 10, No. 2, Feb. 1993, pp. 328-332.

R.D. Meade et al., "Photonic bound states in periodic dielectric materials," Rapid Communications, Physical Review B, vol. 44, No. 24, Dec. 15, 1991-II, pp. 13772-13774.

S.G. Johnson, Photonic Crystals: Periodic Surprises in Electromagnetism, 29 pgs, (2003).

Ze Zhang et al., "Electromagnetic Wave Propagation in Periodic Structures: Bloch Wave Solution of Maxwell's Equations," Physical Review Letters, vol. 65, No. 21, Nov. 19, 1990, pp. 2650-2653.

* cited by examiner

INFRA-RED REFLECTING LAYERED STRUCTURE

FIELD OF THE INVENTION

The invention relates to an infra-red reflecting layered structure and to the use of such a layered structure as heat-mirror.

BACKGROUND OF THE INVENTION

Heat-mirrors that reflect radiation in the infrared spectrum while transmitting radiation in the visible spectrum have important applications for example as windows in buildings or vehicles.

For transparent heat-mirrors, visual light transmittance must be high, and hence the reflectivity and absorptivity must be low.

In the United States of America for example, automotive windshields must have a transmittance of visible light of at least 70%.

In the infrared, however, the heat-mirror must have high reflectivity and so transmittance and absorptivity in the infra-red must be low.

Heat-mirrors comprising a stack of alternating dielectric and metal layers are known in the art.

To obtain a heat-mirror characterised by a low heat transmittance, generally at least three metal layers are necessary. However, the number and the thickness of the metal layers have a negative influence on the visual light transmittance and on the cost and complexity of the manufacturing process.

It is well known to use silver as metal layer. However, a silver layer has a low stability, low durability and poor moisture and weather resistance.

SUMMARY OF THE INVENTION

It is an object of the present invention to avoid the drawbacks of the prior art.

It is another object of the invention to provide an improved infra-red reflecting layered structure.

It is also an object to provide an infra-red reflecting layered structure characterised by a good visual light transmittance and a low solar heat gain coefficient with a minimum number of metal layers.

It is a further object of the invention to provide an infra-red reflecting layered structure having silver containing layers with a high stability and a high weather resistance.

According to a first aspect of the present invention an infra-red reflecting layered structure is provided. The layered structure comprises:
- a transparent substrate layer;
- a first metal oxide layer;
- a first silver containing layer;
- a second metal oxide layer;
- a second silver containing layer and
- a third metal oxide layer.

The first, second and third metal oxide layer have a refractive Index of at least 2.40 at a wavelength of 500 nm.

In the layered structure according to the present invention, the number of pairs silver containing layer—metal oxide layer is limited to two. The thickness of the various metal oxide layers and the thickness of the first and second silver containing layers are adapted to each other so that the layered structure, laminated on glass, has a visual light transmittance (VLT) higher than 70% and a solar heat gain coefficient (SHGC) lower than 0.44.

The light to solar gain ratio (LSG ratio) of the layered structure laminated on glass is preferably higher than 1.60. More preferably, the LSG ratio is higher than 1.65, for example 1.69.

The visual light transmittance (VLT) refers to the percentage of the visible spectrum (380-780 nm) that is transmitted through a window.

The solar heat gain coefficient (SHGC) is the fraction of incident solar radiation (350-2500 nm) admitted through a window, both directly transmitted and absorbed and subsequently released inward by means of convection and radiation. SHGC is expressed as a number between 0 and 1. The lower a window's solar heat gain coefficient, the less solar heat it transmits.

The light to solar gain ratio (LSG ratio) is defined as $$\frac{VLT}{SHGC*100}.$$

The LSG ratio provides a gauge of the relative efficiency of different glass types in transmitting daylight while blocking heat gains. The higher the ratio, the brighter the room is without adding excessive amounts of heat.

The metal oxide may comprise any transparent material. However, metal oxide having a high refractive index and an almost zero extinction coefficient are preferred.

Therefore, in optical coatings where the optical thickness of the layers is of importance, the physical thickness of metal oxide having a high refractive index can be kept lower than the physical thickness of metal oxides having a lower refractive index.

The metal oxide layers of the layered structure can be deposited by any technique known in the art. Preferred techniques comprise physical vapor deposition techniques such as sputter deposition or chemical vapor deposition techniques.

A preferred metal oxide layer comprises $TiO_2$ and more particularly $TiO_2$ that is mainly composed of rutile phase and that is very dense. This type of $TiO_2$ has a refractive index of 2.41 at 510 nm.

A $TiO_2$ layer can be deposited by a reactive sputter deposition process from a Ti-target, a $TiO_2$-target or a substoichiometric $TiO_x$-target (with x between 1.75 and 2).

$TiO_2$ mainly composed of rutile phase is preferably deposited by DC magnetron sputtering using a $TiO_x$ targets (preferably a rotatable $TiO_x$ target) with x between 1.5 and 2, for example between 1.5 and 1.7.

These rotatable targets are produced by plasma spraying of rutile powder in a reducing atmosphere (e.g. $Ar/H_2$) on a stainless steel backing tube. The targets have enough electrical conductivity to be used as cathodes in a DC magnetron sputtering process and can withstand extremely high power levels. As a result, it is possible to achieve very high sputter deposition rates, at lower investment cost (both the deposition source itself and the power supply are considerably cheaper).

Other metal oxides having a high refractive index are for example $BiO_2$ (refractive index 2.45 at 550 nm) or $PbO$ (refractive index 2.55 at 550 nm).

The different metal oxide layers of the layered structure may comprise the same material or may comprise a different material.

The first and second silver containing layers may comprise pure silver (i.e. silver with unavoidable impurities) or silver in combination with another element as for example gold, platinum, palladium, copper, aluminium, indium or zinc and/or mixtures thereof.

The silver containing layers comprise for example silver and up to 30 wt % of another element such as gold, platinum, palladium, copper, aluminium, indium or zinc and/or mixtures thereof.

A preferred silver containing layer comprises 10 wt % gold.

The silver containing layers are preferably deposited by a vacuum deposition technique, for example by sputtering or evaporation.

The deposition of the silver containing layers needs special precautions, because
(i) silver is, although often referred to as a precious metal, very prone to corrosion, and
(ii) the intermixing of the metal oxide and the silver layers has to be avoided: absorptance is essentially proportional to η.k; hence the presence of a rather thick mixed TiO2 (high η)—Ag (high k) layer will seriously increase the total absorptance of the layered structure and can eat away a big part of the theoretically achievable visual light transmittance.

This means that it can be preferred that the silver containing layer and/or the interface between the silver containing layer and the metal oxide layer is specially protected. This can for example be achieved by means of an intermediate layer between the metal oxide layer and the silver containing layer; between the silver containing layer and the metal oxide layer or by means of an intermediate layer on both sides of the silver containing layer.

Such an intermediate layer preferably comprises gold, for example pure gold (i.e. gold with unavoidable impurities) or gold in combination with up to 30 wt % of another element such as silver.

The intermediate layer has preferably a thickness between 0.5 and 10 nm, for example 1 nm.

Preferably, the intermediate layer is deposited by sputter deposition.

The layered structure according to the present invention comprises at least one transparent substrate layer.

The transparent substrate layer or layers may comprise a glass layer or a plastic layer for example a plastic layer made of polycarbonate, polyacrylate, polyester such as polyethylene terephtalate (PET), cellulose tri acetated (TCA or TAC) or polyurethane.

Possibly, an additional layer is deposited on top of the layered structure. Such an additional layer comprises for example a protective layer or an abrasion resistant layer.

According to a second aspect of the invention, the use of an infra-red reflecting layered structure as a transparent heat-mirror is provided.

According to further aspects a method of reducing the number of silver containing layers in an infra-red reflecting layered structure and a method of improving the visual light transmittance of an infra-red reflecting layered structure are provided.

BRIEF DESCRIPTION OF THE DRAWINGS

The invention will now be described into more detail with reference to the accompanying drawings wherein.

DESCRIPTION OF THE PREFERRED EMBODIMENTS OF THE INVENTION

Figure 1:
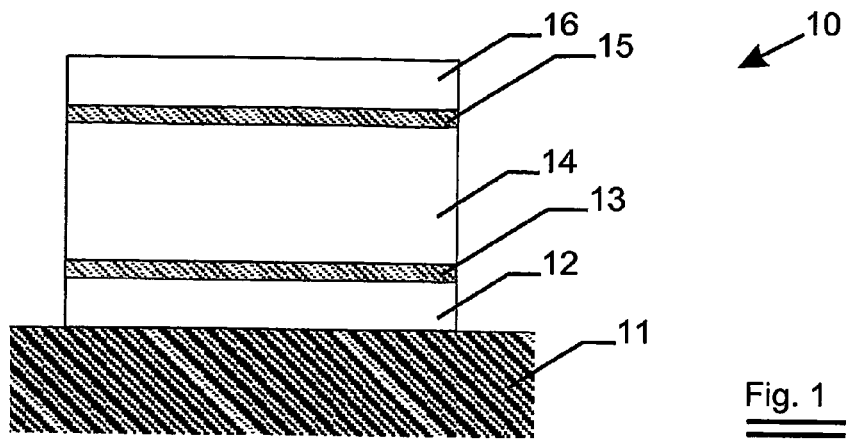
FIGS. 1, 2 and 3 show different embodiments of an infra-red reflecting layered structure according to the present invention.

An embodiment of an infra-red reflecting layered structure 10 is shown in FIG. 1. The layered structure comprises three metal oxide layers 12, 14, 16 and two silver containing layers 13,15.

The metal oxide layers comprise $TiO_2$.

The $TiO_2$ is obtained by DC magnetron sputtering using rotatable ceramic $TiO_x$ targets with x between 1.5 and 1.7. These targets have enough electrical conductivity to be used as cathodes in a DC magnetron sputtering process.

Figure 4:
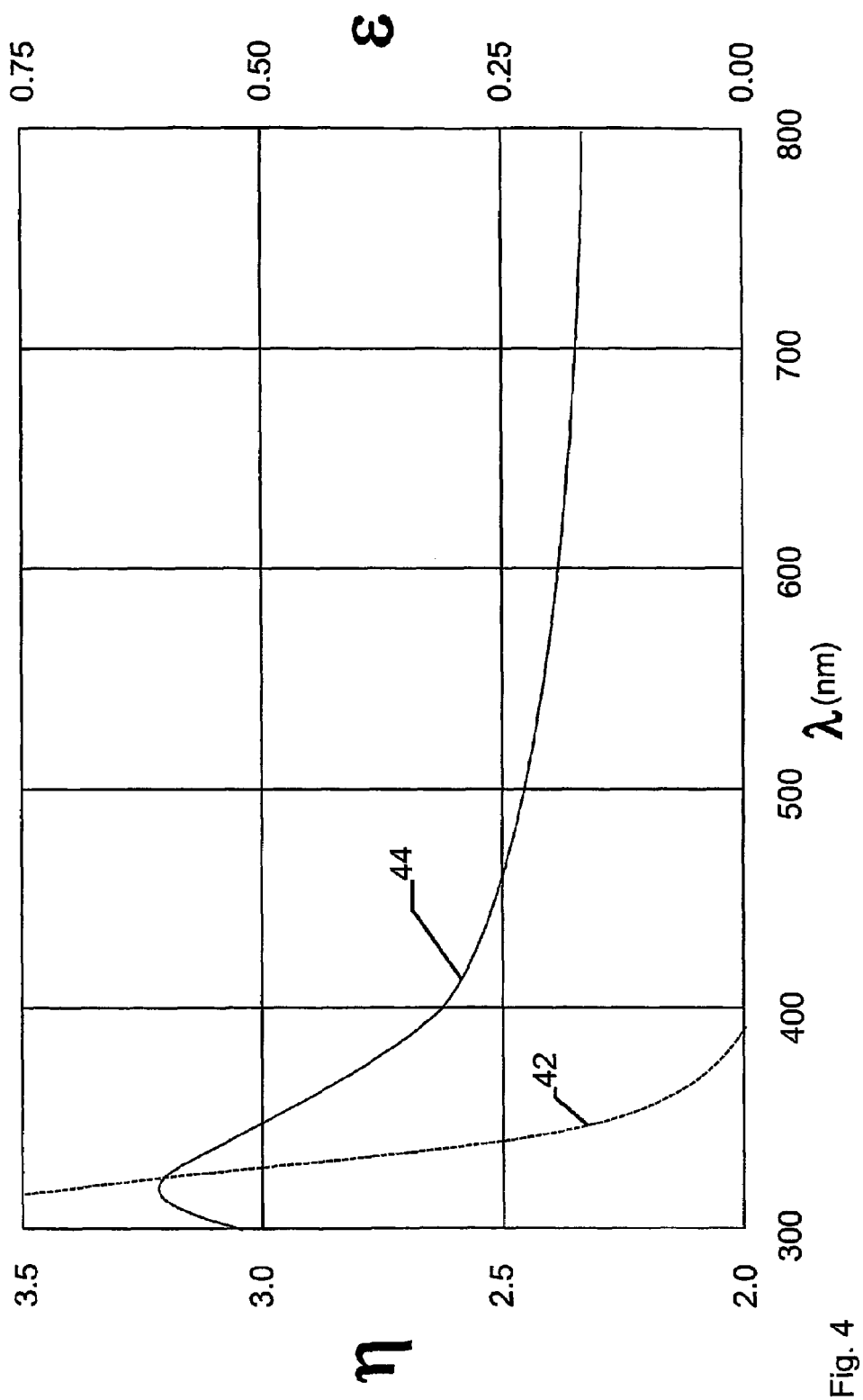
FIG. 4 shows the optical properties of a $TiO_2$ coating.

In FIG. 4, the refractive index (η) and the extinction coefficient (∈) of a $TiO_2$ coatings can be seen. The refractive index (η) in function of the wavelength is given by line 44; the extinction coefficient (∈) of In function of the wavelength is given by line 42.

For wavelengths higher than 395 nm, the coating is absorption free. The refractive index at 510 nm is 2.41, which corresponds to the rutile phase of $TiO_2$.

The silver containing layers 12, 14 comprise pure silver (i.e. silver with unavoidable impurities).

In an alternative embodiment the silver containing layers 12, 14 comprise a silver layer comprising 10 wt % gold.

The first metal oxide layer 12 and the third metal oxide layer 16 have a thickness ranging between 25 and 35 nm.

The second metal oxide layer 14 has a thickness between 50 and 70 nm.

The first and second silver containing layer 13, 15 have a thickness between 10 and 25 nm.

Figure 2:
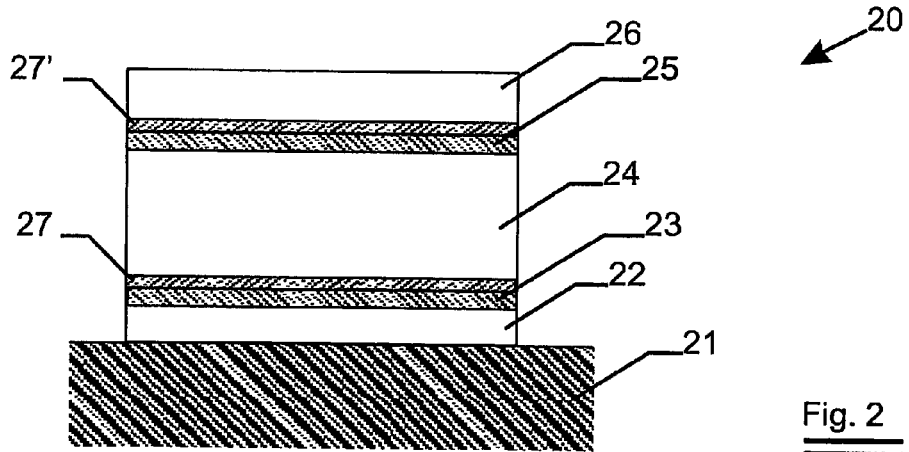

FIG. 2 shows another embodiment of an infra-red reflecting layered structure 20. The layered structure is the same as the layered structure shown in FIG. 1 but additionally comprises intermediate layers 27, 27', respectively between the first silver containing layer 22 and the second metal oxide layer 24 and between the second silver containing layer 25 and the third metal oxide layer 26.

The intermediate layers comprise gold and have a thickness of 1 nm.

The intermediate layers increase the stability and durability of the silver containing layers and avoid the intermixing at the interface of the silver containing layer and the metal oxide layer.

Figure 3:
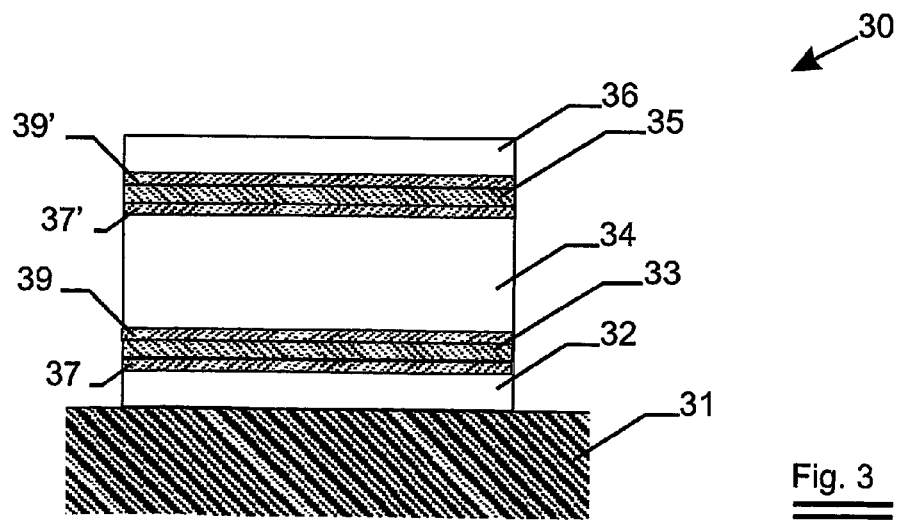

FIG. 3 shows a further embodiment of an infra-red reflecting layered structure 30. Intermediate layers 37, 37' and 39, 39' are deposited on both sides of the silver containing metal layers 33, 35.

The intermediate layers comprise gold or gold comprising 10 wt % silver.

The intermediate layers have a thickness of 1 nm.

Figure 5:
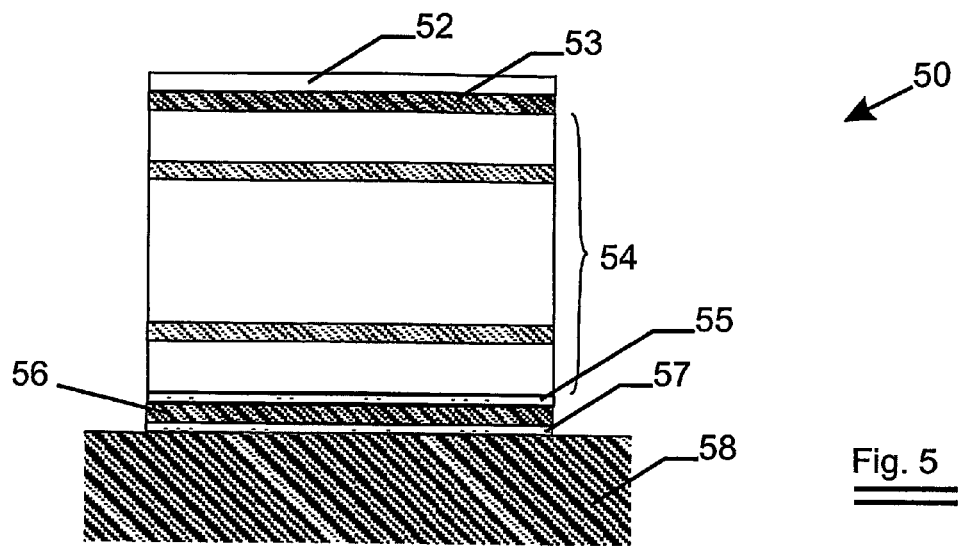
FIG. 5 shows the cross-section of a spectrally selective solar control window film.

FIG. 5 shows the cross-section of a spectrally selective solar control window film 50 comprising:

a hard coat top layer 52 for example comprising a cross-linked acrylate;
a first PET film 53 having a thickness of for example 23 µm;
a layered structure 54 according to the present invention;
a first adhesive layer 55;
a second PET film 56 having a thickness of for example 23 µm;
a second adhesive layer 57;
a glass layer 58.

FIG. 5 shows the sequence of the different layers. The thickness of the different layers is not in proportion to the real thickness.

Figure 6:
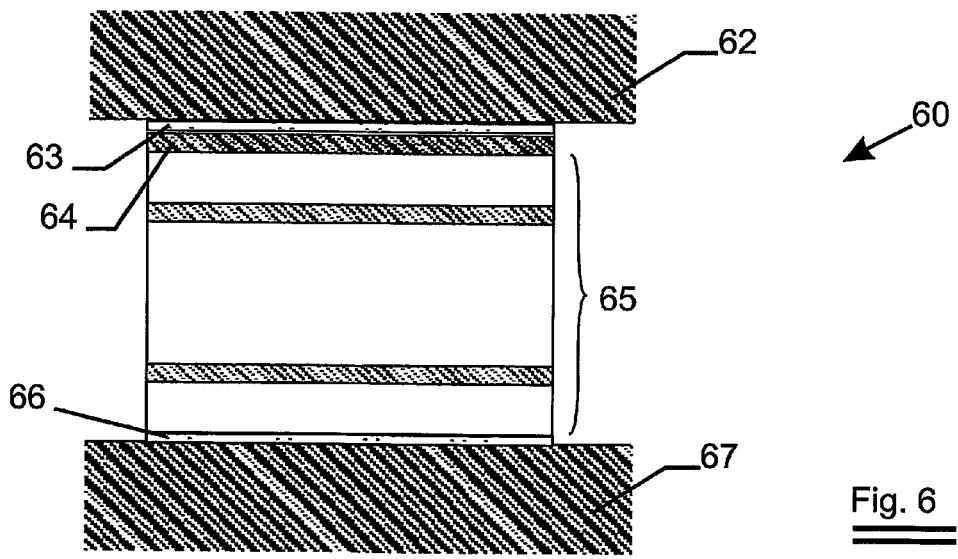
FIG. 6 shows the cross-section of an automotive glazing comprising a layered structure according to the present invention.

FIG. 6 shows the cross-section of an automotive glazing comprising:
a first glass layer 62;
a first adhesive layer 63 for example comprising a PVB layer having a thickness of 375 µm;
a PET film 64 having a thickness of for example 50 µm;
a layered structure 65 according to the present invention;
a second adhesive layer 66 for example comprising a PVB layer having a thickness of 375 µm;
a glass layer 67.

The optical properties of the spectrally selective solar control window shown in FIG. 5 are given in Table 1.

TABLE 1

| | Visual properties | |
|---|---|---|
| VLT | Visual Light Transmittance (%) | 71 |
| VLR | Visual Light Reflectance (%) | 9 |
| | Solar Properties | |
| SHGC | Solar Heat Gain Coefficient | 0.42 |
| TSER | Total Solar Energy Reflected (%) | 58 |
| LSG ratio | light-to-solar-gain ratio | 1.69 |
| | UV properties | |
| TUV | UV Transmittance (%) | <0.2 |

Figure 7:
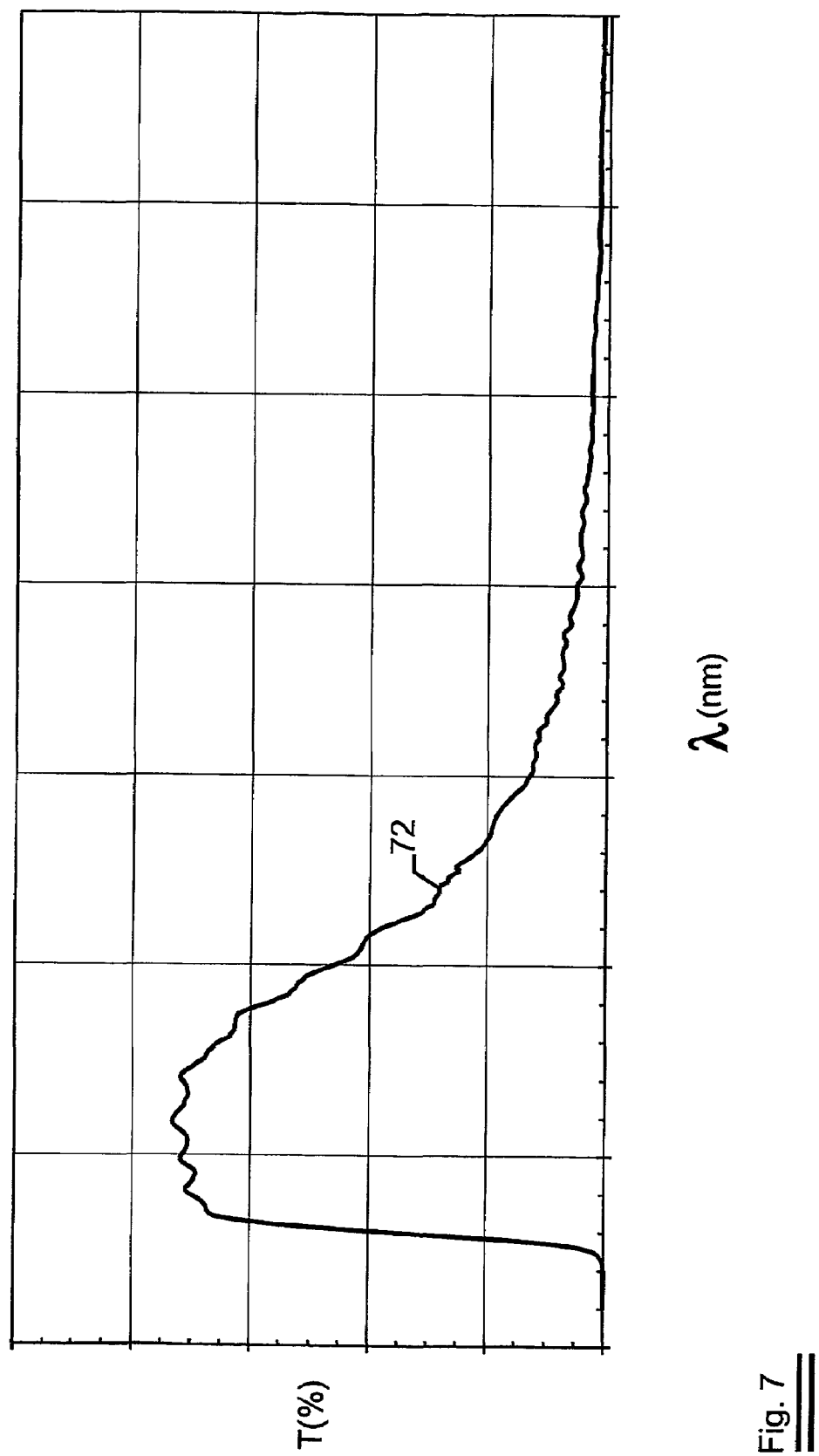
FIG. 7 shows the transmittance of a layered structure according to the present invention.

The transmittance T (expressed in %) of the spectrally selective solar control window film as shown in FIG. 5 is given in FIG. 7 for the UV, visible and near infra-red.

Figure 8:
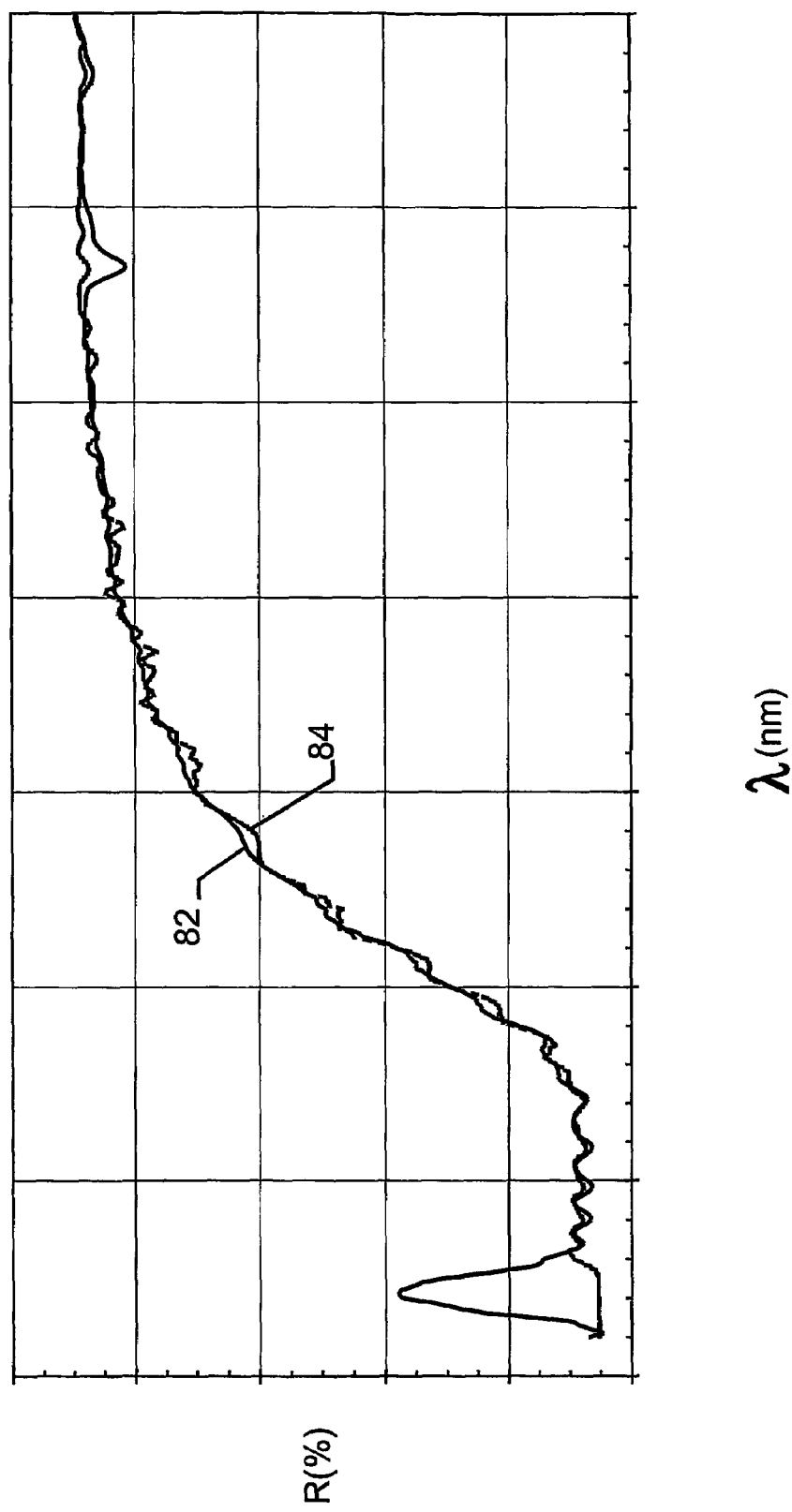
FIG. 8 shows the reflectance of a layered structure according to the present invention.

The reflectance R (expressed in %) of the spectrally selective solar control window film as shown in FIG. 5 is given in FIG. 8. The reflectance is measured on the glass side (line 82) and measured on the film side (line 84).

This infra-red reflecting structure according to the present invention combines a high visual light transmittance (VLT), with a low visual light reflectance and with a low solar heat gain coefficient (SHGC). The structure is furthermore characterized by a neutral color.

Infra-red reflecting layered structures known in the art need three silver containing layers to obtain the desired low solar heat gain coefficient. The layered structures according to the present invention have a low solar heat gain coefficient with only two silver containing layers. This reduced number of silver containing layers has a positive influence on the visual light transmittance.

Figure 9:
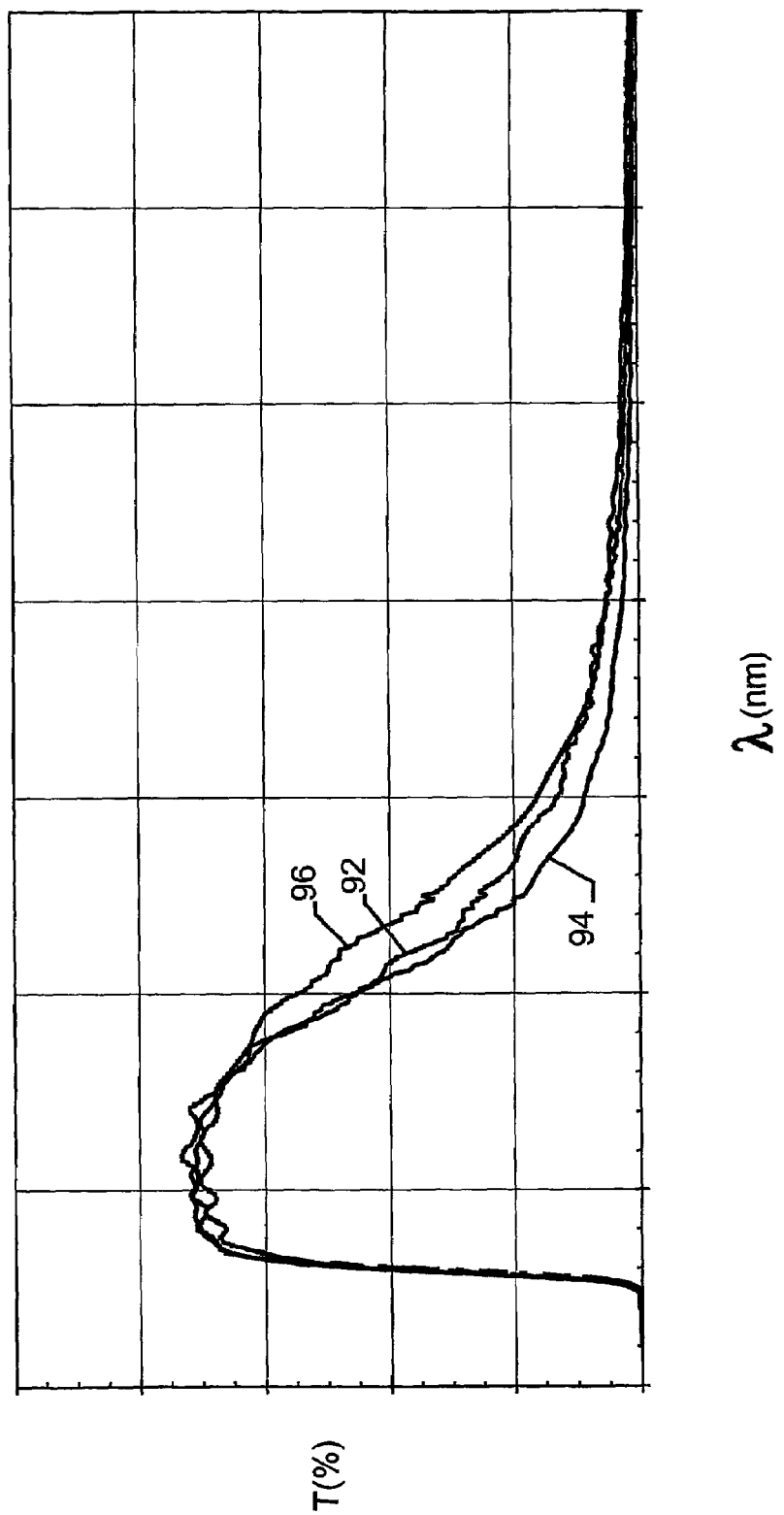
FIGS. 9 and 10 compares the transmittance and the reflectance of a layered structure according to the present invention with two other types of layered structures.
Figure 10:
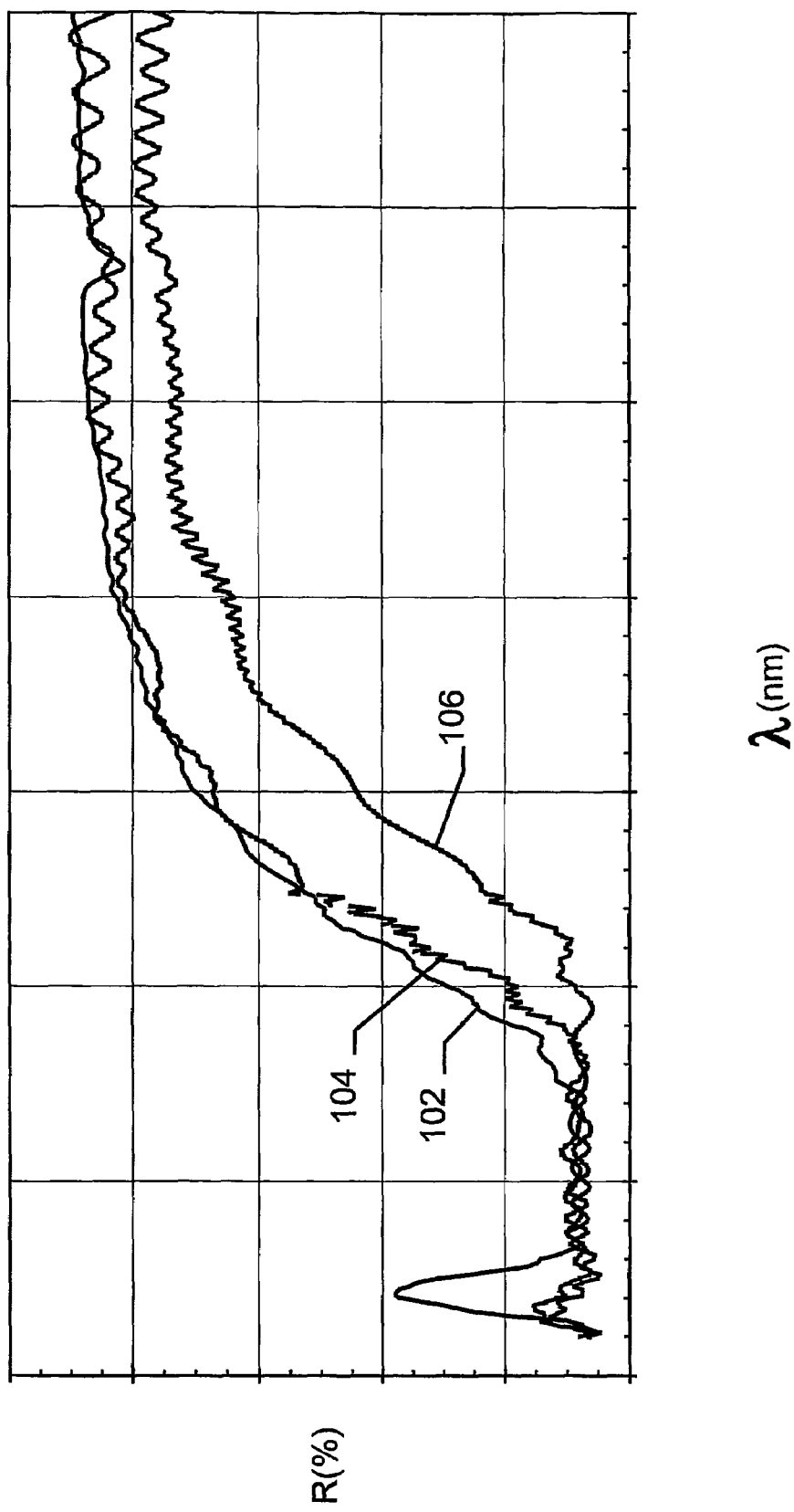

In FIGS. 9 and 10, the transmittance and reflectance of the spectrally selective solar control window film as shown in FIG. 5 is compared with two other films: film A and film B.

In FIG. 9, the transmittance of the spectrally selective solar control window film according to the present prevention is given by line 92; the transmittance of film A is given by line 94 and the transmittance of film B is given by line 96.

In FIG. 10, the reflectance of the spectrally selective solar control window film according to the present prevention is given by line 102; the reflectance of film A is given by line 104 and the reflectance of film B is given by line 106.

Film A comprises alternating layers of $In_2O_3$ and of AgAu:
$In_2O_3$ layer/AgAu alloy layer/$In_2O_3$ layer/AgAu alloy layer/$In_2O_3$ layer/AgAu alloy layer/$In_2O_3$ layer.

Film B comprises alternating layers of $SnO_2$ and Ag:
$SnO_2$ layer/Ag layer/$SnO_2$ layer/Ag layer/$SnO_2$ layer.

From FIG. 9, it can be concluded that the visual light transmittance (VLT) of the structure according to the present invention is almost equal to the VLT of film A.

This means that for the structure according to the present invention the desired VLT can be obtained with only two silver containing layers, whereas the structure of film A needs three silver containing layers.

From FIG. 10, it can be concluded that the reflectance of the infra-red of the structure according to the present invention is higher than the reflectance of the infra-red of the structure of film B.

The invention claimed is:

1. A layered structure comprising consecutively:
an infra-red reflecting layered structure, said infra-red reflecting layered structure comprising:
a first transparent substrate layer;
a first metal oxide layer;
a first silver containing layer;
a second metal oxide layer;
a second silver containing layer;
a third metal oxide layer;
a first adhesive layer;
a second transparent substrate layer;
a second adhesive layer; and
a glass substrate,
wherein said infra-red reflecting layered structure further comprises at least one protective intermediate layer comprising gold, said protective intermediate layer being located on both sides of at least one of the first and second silver containing layers;
said first, second and third metal oxide layer having a refractive index of at least 2.40 at a wavelength of 500 nm and said infra-red reflecting layered structure, having a visual light transmittance (VLT) higher than 70% and a solar heat gain coefficient (SHGC) lower than 0.44.

2. A layered structure according to claim 1, wherein said infra-red reflecting layered structure has a light to solar gain ratio (LSG ratio) higher than 1.60.

3. A layered structure according to claim 1, wherein said first, second and third metal oxide layer comprises $TiO_2$.

4. A layered structure according to claim 3, wherein said $TiO_2$ is mainly composed of rutile phase.

5. A layered structure according to claim 1, wherein said first and second silver containing layer have a thickness between 10 and 25 nm.

6. A layered structure according to claim 1, wherein said first, second and third metal oxide layer have a thickness between 25 and 70 nm.

7. A layered structure according to claim 1, wherein the infra-red reflecting layered structure is a transparent heat-mirror.

8. A layered structure comprising consecutively:
an infra-red reflecting layered structure, said infra-red reflecting layered structure comprising:
a first transparent substrate layer;
a first metal oxide layer;
a first silver containing layer;
a second metal oxide layer;

a second silver containing layer;
a third metal oxide layer;
a first adhesive layer;
a second transparent substrate layer;
a second adhesive layer; and
a glass substrate,
wherein said infra-red reflecting layered structure further comprises at least one protective intermediate layer comprising gold, said protective intermediate layer being located between a silver containing layer and a metal oxide layer and/or between a metal oxide layer and a silver containing layer;

wherein said first, second and third metal oxide layer is titanium dioxide deposited by reactive DC magnetron sputtering from a substoichimetric $TiO_x$ target where x is in the range between 1.5 to 2, and wherein said first, second and third metal oxide layer has a refractive index of at least 2.40 at a wavelength of 500 nm and having a visual light transmittance (VLT) higher than 70% and a solar heat gain coefficient (SHGC) lower than 0.44.

* * * * *